United States Patent
Lee et al.

(10) Patent No.: US 8,990,607 B2
(45) Date of Patent: *Mar. 24, 2015

(54) MEMORY INTERFACE CIRCUITS INCLUDING CALIBRATION FOR CAS LATENCY COMPENSATION IN A PLURALITY OF BYTE LANES

(71) Applicant: Uniquify, Incorporated, San Jose, CA (US)

(72) Inventors: Jung Lee, San Jose, CA (US); Mahesh Goplan, Santa Clara, CA (US)

(73) Assignee: Uniquify, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/081,806

(22) Filed: Nov. 15, 2013

(65) Prior Publication Data

US 2014/0075236 A1 Mar. 13, 2014

Related U.S. Application Data

(63) Continuation of application No. 14/023,630, filed on Sep. 11, 2013, now Pat. No. 8,843,778, which is a continuation of application No. 13/172,740, filed on Jun. 29, 2011, now Pat. No. 8,861,285, which is a continuation-in-part of application No. 12/157,081, filed on Jun. 6, 2008, now Pat. No. 7,975,164.

(51) Int. Cl.
*G06F 1/00* (2006.01)
*G06F 1/12* (2006.01)
(Continued)

(52) U.S. Cl.
CPC .............. *G06F 1/08* (2013.01); *G06F 13/1689* (2013.01); *G06F 13/4243* (2013.01); *G11C 29/02* (2013.01); *G11C 29/028* (2013.01); *G11C 29/50* (2013.01); *G11C 29/50012* (2013.01); *G06F 1/12* (2013.01); *G06F 12/0646* (2013.01); *G11C 7/222* (2013.01); *G06F 1/04* (2013.01); *G06F 3/0619* (2013.01); *G06F 3/065* (2013.01); *G06F 3/067* (2013.01); *G06F 1/14* (2013.01)
USPC ............ 713/500; 713/401; 713/600; 326/38; 326/93; 365/193; 365/194; 365/233.13; 702/106; 702/117; 702/124; 711/103; 711/167; 711/170; 714/718; 714/724

(58) Field of Classification Search
CPC ..................................... G06F 1/08; G06F 1/04
USPC ...................... 713/401, 500, 600; 326/38, 93; 365/193, 194, 233.13; 702/106, 117, 702/124; 711/103, 167, 170; 714/718, 724
See application file for complete search history.

(56) References Cited

U.S. PATENT DOCUMENTS 6,182,253 B1 * 1/2001 Lawrence et al. .............. 714/718
6,563,759 B2 * 5/2003 Yahata et al. .............. 365/233.1
(Continued)

*Primary Examiner* — Stefan Stoynov
(74) *Attorney, Agent, or Firm* — Cherskov Flaynik & Gurda, LLC

(57) ABSTRACT

A memory interface circuit for read operations is described. The circuit includes one or more controller circuits, one or more read data delay circuits for providing CAS latency compensation for byte lanes. In the system, control settings for the read data delay circuits for providing CAS latency compensation are determined and set using controller circuits according to a dynamic calibration procedure performed from time to time. In the system, determining and setting the control settings for the read data delay circuits for providing CAS latency compensation is performed independently and parallely in each of a plurality of byte lanes.

19 Claims, 18 Drawing Sheets

(51) Int. Cl.

| | | |
|---|---|---|
| G06F 1/04 | (2006.01) | |
| H03K 19/173 | (2006.01) | |
| H03K 19/00 | (2006.01) | |
| G11C 11/00 | (2006.01) | |
| G11C 8/16 | (2006.01) | |
| G01R 35/00 | (2006.01) | |
| G01R 27/28 | (2006.01) | |
| G06F 12/00 | (2006.01) | |
| G11C 29/00 | (2006.01) | |
| G01R 31/28 | (2006.01) | |
| G06F 1/08 | (2006.01) | |
| G06F 13/16 | (2006.01) | |
| G06F 13/42 | (2006.01) | |
| G11C 29/02 | (2006.01) | |
| G11C 29/50 | (2006.01) | |
| G06F 12/06 | (2006.01) | |
| G11C 7/22 | (2006.01) | |
| G06F 3/06 | (2006.01) | |
| G06F 1/14 | (2006.01) | |

(56) References Cited

U.S. PATENT DOCUMENTS

| | | | |
|---|---|---|---|
| 7,444,535 B2* | 10/2008 | Hsieh et al. | 713/600 |
| 7,724,606 B2* | 5/2010 | Osawa et al. | 365/233.13 |
| 7,924,637 B2* | 4/2011 | Searles et al. | 365/194 |

* cited by examiner

MEMORY INTERFACE CIRCUITS INCLUDING CALIBRATION FOR CAS LATENCY COMPENSATION IN A PLURALITY OF BYTE LANES

PRIORITY CLAIM

This application is a continuation of U.S. application Ser. No. 14/023,630, filed on Sep. 11, 2013, presently pending, which in turn was a continuation of U.S. application Ser. No. 13/172,740 filed on Jun. 29, 2011, issued as U.S. Pat. No. 8,661,285 on Feb. 25, 2014, which in turn claimed priority as a Continuation-In-Part of U.S. Utility patent application Ser. No. 12/157,081 filed on Jun. 6, 2008, patented as U.S. Pat. No. 7,975,164 on Jul. 5, 2011, each by inventors Jung Lee and Mahesh Gopalan, each application commonly assigned with the present application and each incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to circuits that interface with dynamic memories, in particular DDR or "double data rate" memories. Such circuits are found in a wide variety of integrated circuit devices including processors, ASICs, and ASSPs used in a wide variety of applications, as well as devices whose primary purpose is interfacing between memories and other devices.

BACKGROUND

Double Data Rate, or "DDR" memories are extremely popular due to their performance and density, however they present challenges to designers. In order to reduce the amount of real estate on the memory chips, much of the burden of controlling the devices has been offloaded to circuits known as DDR memory controllers. These controller circuits may reside on Processor, ASSP, or ASIC semiconductor devices, or alternately may reside on semiconductor devices dedicated solely to the purpose of controlling DDR memories. Given the high clock rates and fast edge speeds utilized in today's systems, timing considerations become challenging and it is often the case that timing skews vary greatly from one system implementation to another, especially for systems with larger amounts of memory and a greater overall width of the memory bus.

In general, the industry has responded by moving towards memory controllers that attempt to calibrate themselves during a power-on initialization sequence in order to adapt to a given system implementation. Such an approach has been supported by the DDR3 standard where a special register called a "Multi-Purpose Register" is included on the DDR3 memories in order for test data to be written prior to the calibration test performed during power-on initialization. The circuitry on memory controllers typically used for receiving data from DDR memories normally incorporates features into the Phy portion (Physical interface) of the memory controller circuit where the controller can adapt to system timing irregularities, this adaptation sometimes being calibrated during a power-on initialization test sequence.

FIG. 1 Shows a typical prior art DDR memory controller where an Asynchronous FIFO 101 is utilized to move data from the clocking domain of the Phy 102 to the Core clock domain 103. Incoming read data dq0 is clocked into input registers 105 and 106, each of these input registers being clocked on the opposite phase of a delayed version of the dqs clock 107, this delay having been performed by delay element 108.

Asynchronous FIFO 101 typically consists of at least eight stages of flip-flops requiring at least 16 flip-flops in total per dq data bit. Notice also that an additional circuit 109 for delay and gating of dqs has been added prior to driving the Write Clock input of FIFO 101. This is due to the potential that exists for glitches on dqs. Both data and control signals on a typical DDR memory bus are actually bidirectional. As such, dqs may float at times during the transition between writes and reads, and as such be susceptible to glitches during those time periods. For this reason, typical prior art in DDR controller designs utilizing asynchronous FIFOs add gating element 109 to reduce the propensity for errors due to glitches on dqs. After passing through the entire asynchronous FIFO 101, read data is transferred to the core domain according to Core_Clk 110. Additional circuitry is typically added to FIFO 101 in order to deal with timing issues relative to potential metastable conditions given the unpredictable relationship between Core_Clk and dqs.

FIG. 2 shows another prior art circuit for implementing a DDR memory controller, in particular a style utilized by the FPGA manufacturer Altera Corp. Portions of two byte lanes are shown in FIG. 2, the first byte lane represented by data bit dq0 201 and corresponding dqs strobe 202. The second byte lane is represented by dqs strobe 203 and data bit dq0 204. In general, the data and strobe signals connecting between a DDR memory and a DDR memory controller are organized such that each byte or eight bits of data has its own dqs strobe signal. Each of these groupings is referred to as a byte lane.

Looking at the data path starting with dq data bit 201 and dqs strobe 202, these pass through programmable delay elements 205 and 206 respectively before being stored in capture registers 207 and 208. Eventually these signals pass through a series of registers 209, 210, and 211 which are clocked by signals coming from tapped delay line 213. These registers form what is called a levelization FIFO and attempt to align the data bits within a byte lane relative to other byte lanes. Tapped delay line 213 is driven by a PLL re-synchronization clock generator 214 which also drives the final stage registers 212 of the levelization FIFO as well as being made available to the core circuitry of the controller. The PLL resynchronization clock generator 214 is phase and frequency synchronized with dqs. Notice that at this point, data stored in final stage registers 212 has not yet been captured by the core clock of the memory controller. Also notice that the circuit of FIG. 2 utilizes an individual delay element for each data bit such as dq0 201 and dq0 204.

When we examine fully-populated byte lanes, it should be noted that the additional delay elements required to provide an individual programmable delay on all incoming data bits can consume a large amount of silicon real estate on the device containing a DDR memory controller circuit. Such a situation is shown in FIG. 3 where a single dqs strobe 301 requires a single programmable delay 302, while the eight data bits 303 of the byte lane each drive a programmable delay element 304.

FIG. 4 describes some of the timing relationships that occur for a prior art DDR memory controller which uses delay elements within the Phy for individual read data bits. FIG. 4a shows a simplified diagram where a single data bit is programmably delayed by element 401 in addition to the dqs strobe being delayed by element 402. Typically data from input dq is captured on both the rising and falling edges of dqs as shown in FIGS. 1 and 2, however for the sake of simplicity, the diagrams of FIGS. 3-12 only show the schematic and timing for the dq bits captured on the rising edge of dqs. By controlling both of these two delays, the output of capture register 403 can be delayed by any amount within the range of the delay elements before it is passed into the core clock domain and clocked into register 404 by the Core_Clk signal 405. In FIG. 4b, the dqs_delayed signal 406 is placed near the center of the valid window for dq 407 and after being captured in register 403, data then enters the core domain at clock edge 408 is shown as shown. In this scenario the latency to move the data into the core domain is relatively low simply because of the natural relationship between core clock and dqs. This relationship however is extremely dependent upon the system topology and delays, and in fact could have almost any phase relationship.

A different phase relationship is possible as shown in FIG. 4c. Here, a first edge 409 of Core_Clk happens to occur just before the leading edge 410 of dqs_delayed. The result is that each data bit will not be captured in the core clock domain until leading edge 411 of Core_Clk as shown, and thus will be delayed by amount of time 412 before being transferred into the core domain. Thus, while the ability to delay both dq and dqs can accomplish synchronization with the core clock, it may introduce a significant amount of latency in the process.

A DDR memory controller circuit and method is therefore needed that reliably captures and processes memory data during read cycles while requiring a small gate count resulting in implementations requiring a small amount of silicon real estate. The controller should also offer a high yield for memory controller devices as well as a high yield for memory system implementations using those controller devices. Further, it is desirable to provide a DDR memory controller that is calibrated to compensate for system level timing irregularities and for chip process parameter variations—that calibration occurring not only during power-up initialization, but also dynamically during system operation to further compensate for power supply voltage variations over time as well as system level timing variations as the system warms during operation.

SUMMARY

One object of this invention is to provide a DDR memory controller with a more flexible timing calibration capability such that the controller may be calibrated for higher performance operation while at the same time providing more margin for system timing variations.

Another object of this invention is to provide a DDR memory controller with a more flexible timing calibration capability where this timing calibration is operated during the power-up initialization of the device containing the DDR memory controller and, where this timing calibration is performed in conjunction with at least one DDR memory device, both said device and controller installed in a system environment, and where the timing calibration performed by the memory controller takes into account delays in the round-trip path between the DDR memory controller and the DDR memory. By taking into account system delays during this calibration, the overall yield of the system is improved, and effectively the yield of the devices containing the DDR memory controller is also improved since the DDR memory controller is therefore self-adaptive to the irregularities of the system environment.

Another object of this invention is to provide a DDR memory controller that transfers, at an earlier point in time, captured data on memory read cycles from the dqs clock domain to the core clock domain. This reduces the possibility that a glitch on dqs that may occur during the time period where dqs is not driven, would inadvertently clock invalid data into the controller during read cycles.

Another object of this invention is to provide a DDR Memory Controller with a smaller gate count thereby reducing the amount of silicon required to implement the controller and the size and cost of the semiconductor device containing the controller function. Gate count is reduced by eliminating delay elements on the dq data inputs, and by eliminating the use of an asynchronous FIFO for transitioning data from the dqs clock domain to the core clock domain.

Another object of this invention is to move captured data into the core clock domain as quickly as possible for read cycles to minimize latency.

Another object of this invention is to provide a DDR memory controller that is calibrated to compensate for system level timing irregularities and for chip process parameter variations where that calibration occurs dynamically during system operation to compensate for power supply voltage variations over time as well as system level timing variations as the system warms during operation.

DETAILED DESCRIPTION OF THE INVENTION

In contrast to prior art DDR memory controllers where calibration features for timing inconsistencies are implemented only in the Phy portion of the controller, the DDR memory controller of one embodiment of the present invention focuses on utilizing core domain clocking mechanisms, at times combined with circuitry in the Phy, to implement an improved solution for a timing-adaptive DDR memory controller.

Figure 4:
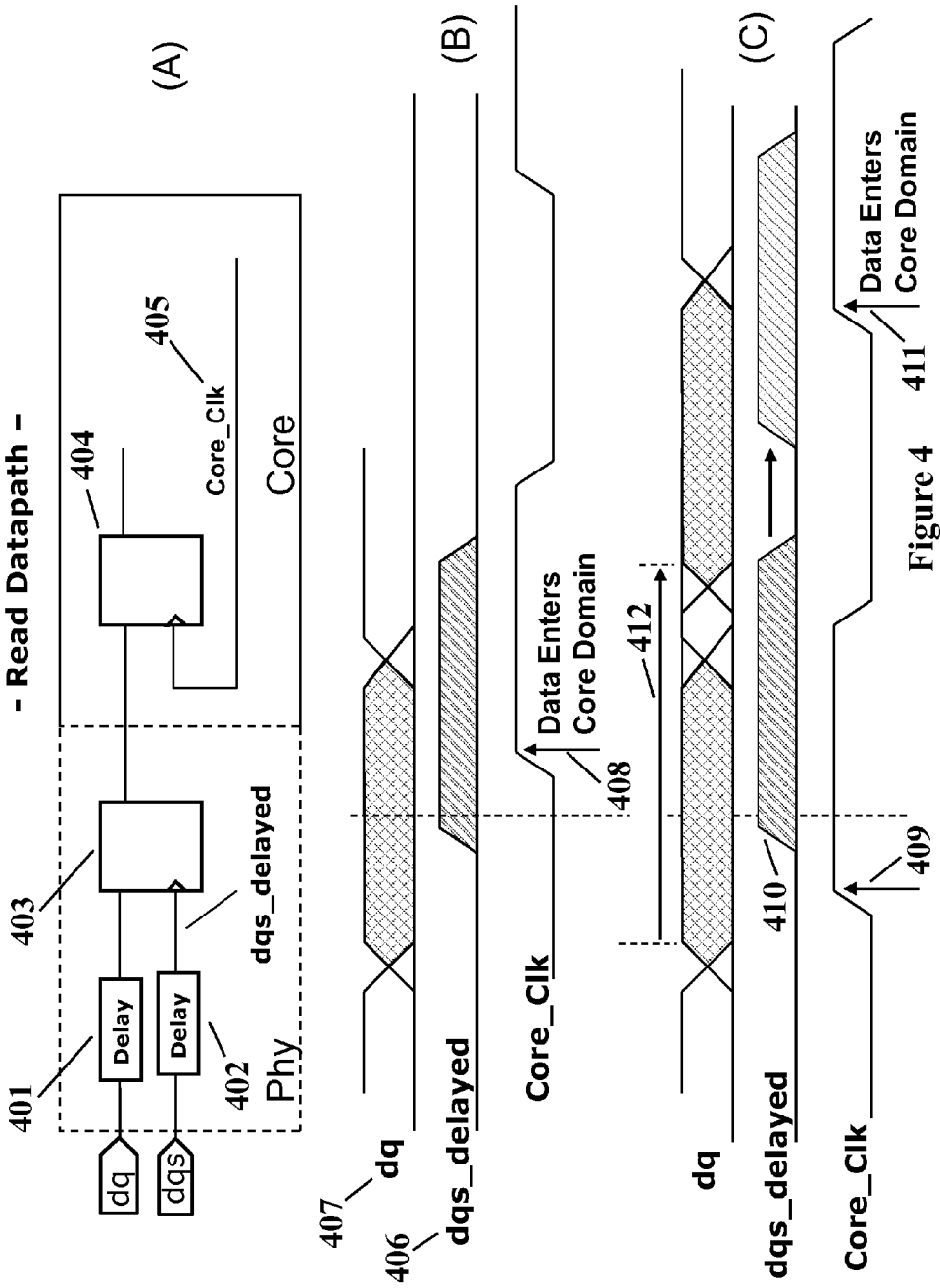
FIG. 4 shows the data capture and synchronization timing for the read data path of a prior art DDR memory controller having delay elements on both dq and dqs inputs.
Figure 5:
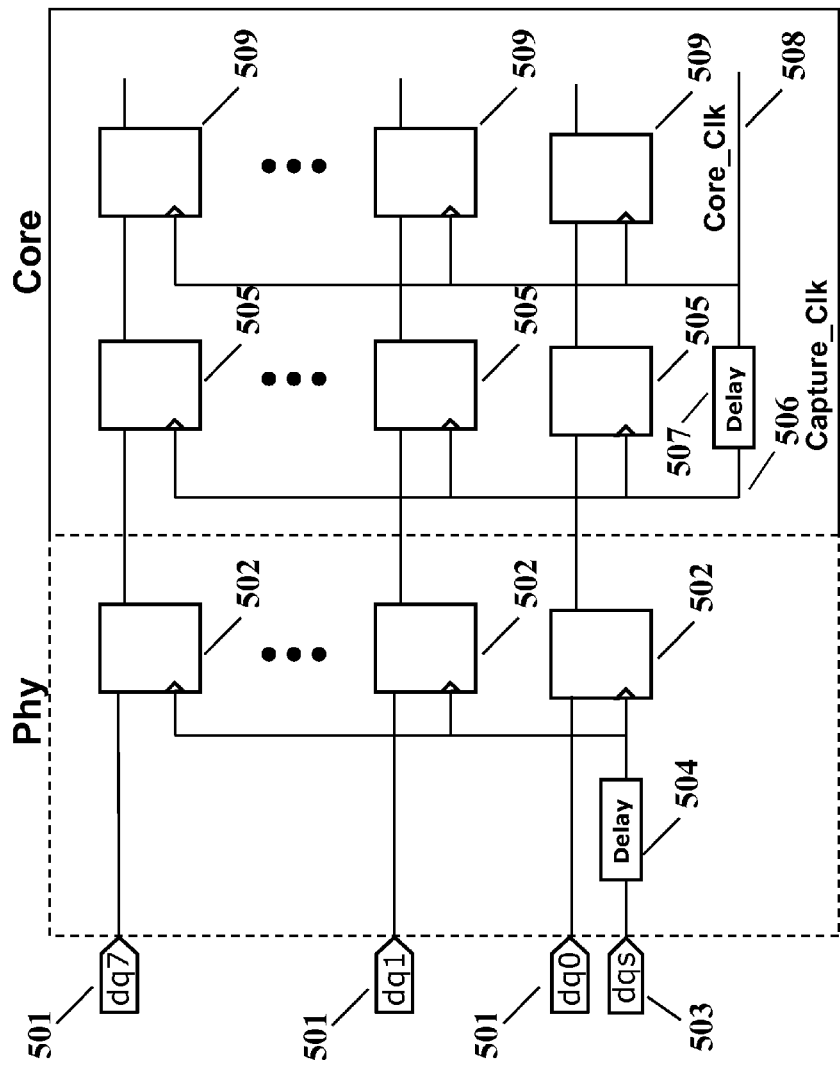
FIG. 5 shows the read data path for a DDR memory controller according to an embodiment of the present invention where delay elements are used on dqs but not on dq inputs, and read data synchronization is performed with the core clock by way of a core clock delay element.

In contrast with the prior art circuit of FIG. 4, FIG. 5 shows a simplified version of a DDR controller circuit according to an embodiment of the present invention. Here, the data inputs for a byte lane 501 are shown being captured in dq read data registers 502 without any additional delay elements added, these registers being clocked by a delayed version of dqs. The dqs clock signal 503 has dqs delay element 504 added, typically delaying dqs by approximately 90 degrees relative to the dqs signal driven by the DDR memory. The outputs of registers 502 enter the core domain and are captured in first core domain registers 505. Registers 505 are clocked by a delayed version of Core_Clk called Capture_Clk 506. Capture_Clk is essentially the output of core clock delay element 507 which produces a programmably delayed version of Core_Clk 508. The outputs of first core domain registers 505 feed second core domain registers 509 which are clocked by Core_Clk. The amount of delay assigned to programmable delay element 507 is controlled by a self-configuring logic circuit (SCL) contained within the memory controller, this self-configuring logic circuit determining the appropriate delay for element 507 during a power-on initialization test and calibration operation.

Figure 6:
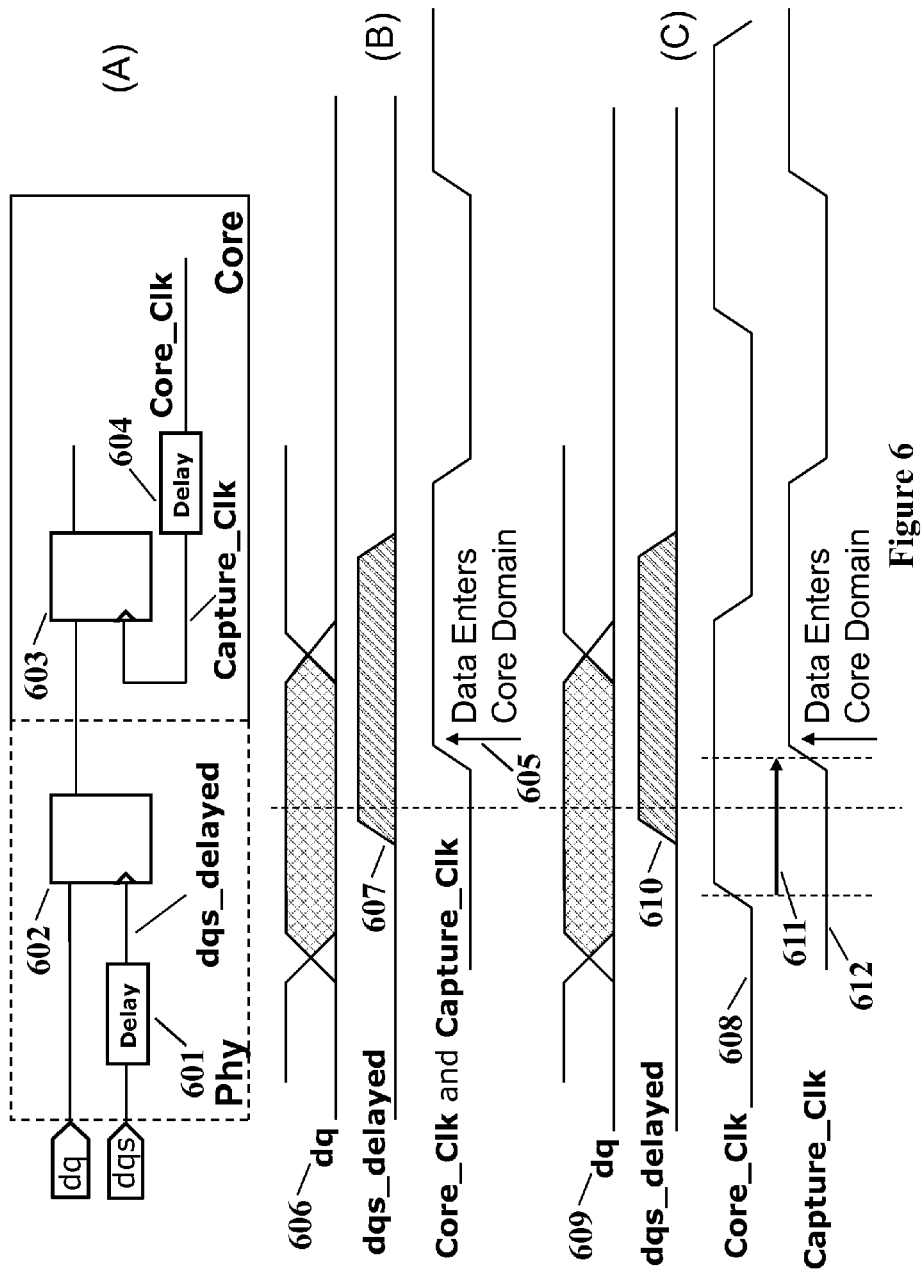
FIG. 6 shows the data capture and synchronization timing for the read data path of a DDR memory controller according to an embodiment of the present invention where delay elements are used on dqs but not on dq inputs, and read data synchronization is performed with the core clock by way of a core clock delay element.

FIG. 6 shows how the timing for the read data path can occur for the DDR memory controller circuit of one embodiment of the present invention. A simplified version of the read data path is shown in FIG. 6a where dqs is delayed by dqs delay element 601 which clocks dq into Phy data capture register 602. The output of data capture register 602 then feeds the first core domain register 603 which is clocked by Capture_Clk, the output of core clock delay element 604. The timing scenario shown in FIG. 6 occurs when the active edge of Core_Clk 605 (depicted in FIG. 6(b)) occurs just after dq data 606 has been clocked into Phy data capture register 602 by dqs_delayed 607. In this scenario, data can be immediately clocked into first core domain register 603, and thus delay element 604 may be programmably set to a delay of essentially zero, making the timing for Capture_Clk essentially the same as Core_Clk.

FIG. 6(c) a shows another timing scenario where the active edge of Core_Clk 608 occurs just prior to dq data 609 being clocked into Phy data capture register 602 by dqs_delayed 610. As a result, core clock delay element 604 will be programmed with delay 611 such that first core domain register 603 is clocked on the active edge of Capture_Clk 612. Thus, regardless of the natural timing of Core_Clk relative to dqs, Capture_Clk will be positioned such that data will move from the Phy domain to the core domain in a predictable manner with minimal added latency due to random clock alignment.

Figure 7:
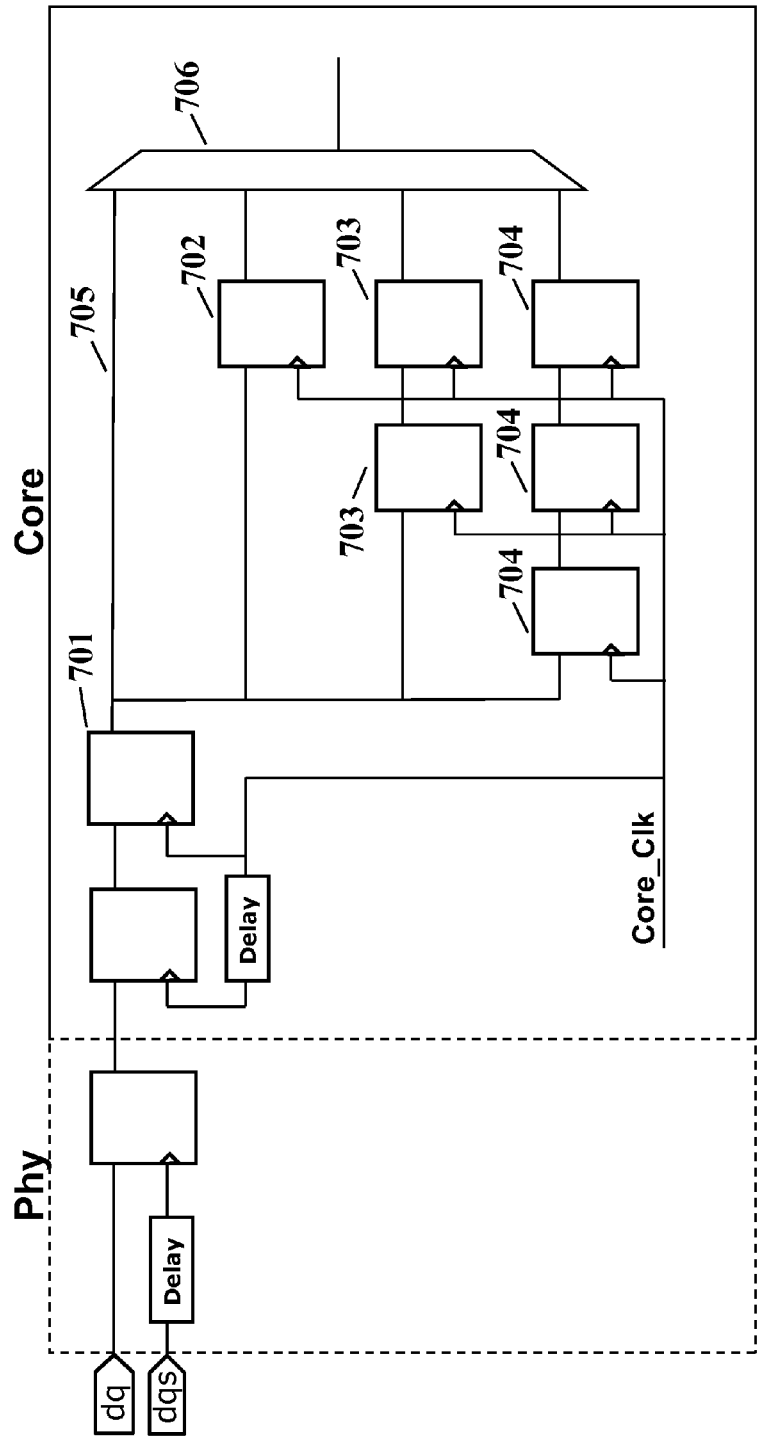
FIG. 7 shows the read data path for a DDR memory controller according to one embodiment of the present invention including a CAS latency compensation circuit which is clocked by the core clock.

FIG. 7 shows an embodiment for the present invention including a circuit that compensates for CAS latency. According to Wikipedia: "CAS latency (CL) is the time (in number of clock cycles) that elapses between the memory controller telling the memory module to access a particular column in the current row, and the data from that column being read from the module's output pins. Data is stored in individual memory cells, each uniquely identified by a memory bank, row, and column. To access DRAM, controllers first select a memory bank, then a row (using the row address strobe, RAS), then a column (using the CAS), and finally request to read the data from the physical location of the memory cell. The CAS latency is the number of clock cycles that elapse from the time the request for data is sent to the actual memory location until the data is transmitted from the module." Thus, there is a timing unpredictability in any system implementation involving DDR memory between the read request from the controller to the memory and the resulting data actually arriving back at the memory controller. The amount of this timing unpredictability can be determined during the power-on initialization test and calibration operation, and then compensated for by the circuit shown in FIG. 7 where the output of second core domain register 701 feeds a partially populated array of registers 702, 703, and 704, which along with direct connection path 705 feed multiplexer 706. These registers are all clocked by Core_Clk and thus create different numbers of clock cycles of CAS latency compensation depending upon which input is selected for multiplexer 706. During the power-on initialization test and calibration operation, different inputs for multiplexer 706 will be selected at different times during the test in order to determine which of the paths leading to multiplexer 706 is appropriate in order to properly compensate for the CAS delay in a particular system installation.

Figure 1:
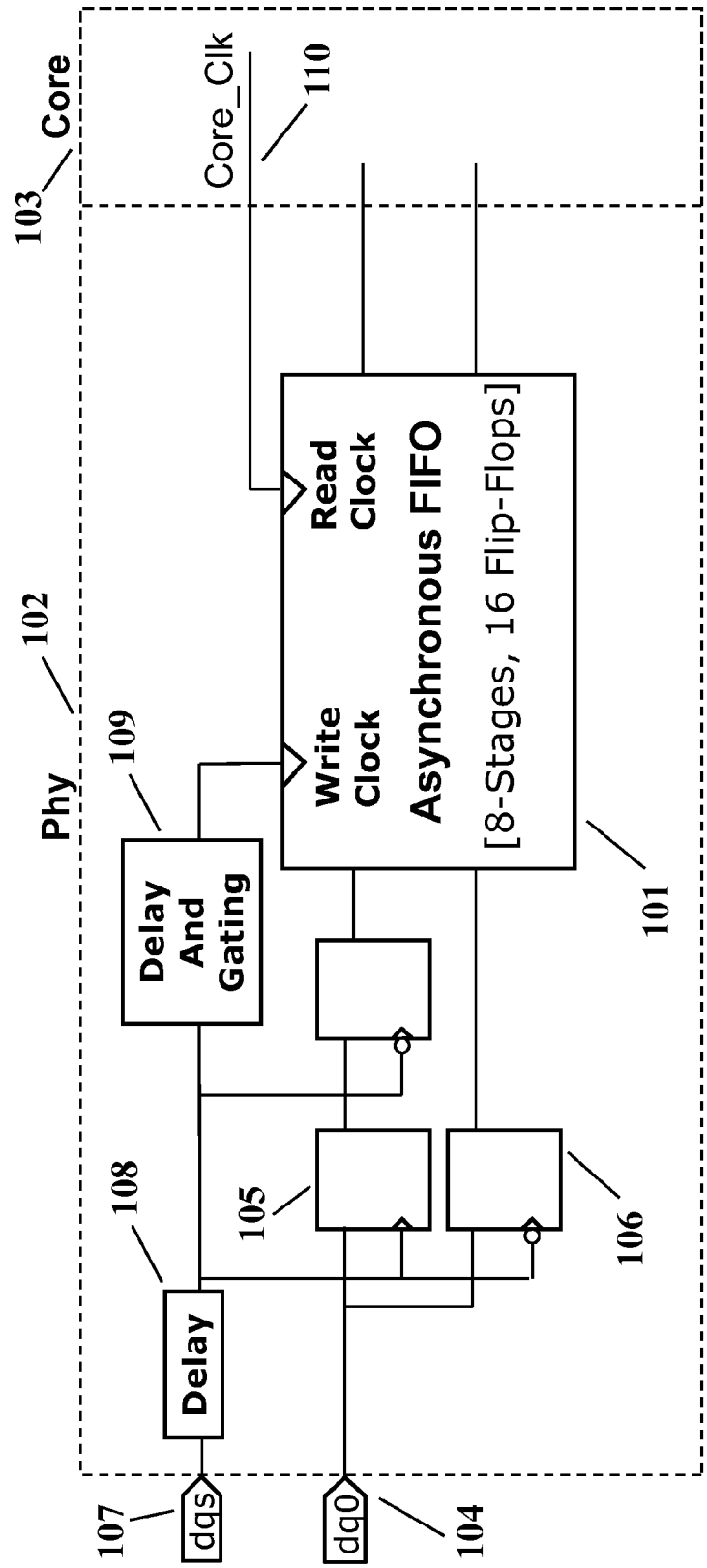
FIG. 1 shows a prior art DDR memory controller which utilizes an asynchronous FIFO with gated clock, all contained within the Phy portion of the controller circuit.
Figure 8:
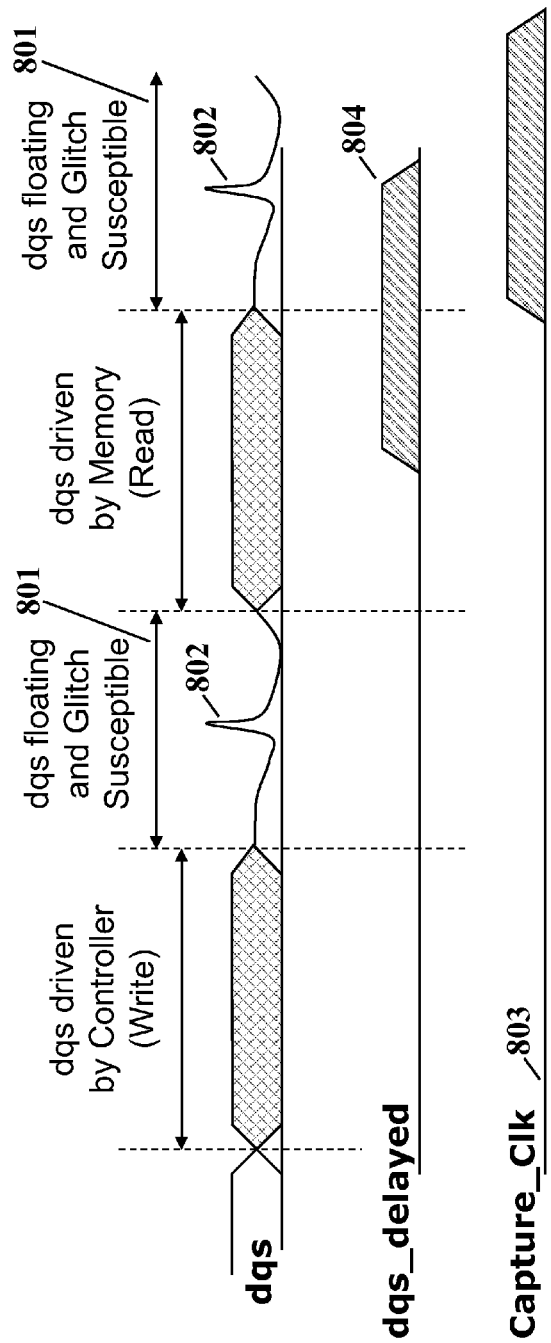
FIG. 8 shows the glitch problem which can occur on the bidirectional dqs signal in DDR memory systems.

In the earlier discussion with reference to FIG. 1, it was mentioned that delay and gating element 109 was included in order to lower the propensity for spurious glitches on dqs inadvertently clocking FIFO 101. The timing diagram of FIG. 8 shows this problem in more detail. During the normal sequence of operation of a DDR memory, the dqs strobe is first driven by the memory controller during a write cycle and then, during a read cycle it is driven by the DDR memory. In between, the there is a transitional time period 801 where the dqs connection may float, that is not be driven by either the memory or the controller. During time periods 801, it is possible for glitches 802 to be induced in dqs from a variety of sources including cross coupling from edges on other signals on boards or in the IC packages for the memory and/or the controller. In order to minimize the chance of any glitch on dqs causing data corruption, the embodiment of the present invention as shown in FIGS. 5 through 7 allows capture clock 803 to be optimally positioned relative to dqs_delayed 804 such that read data is always moved into the core clock domain as early as possible.

Figure 2:
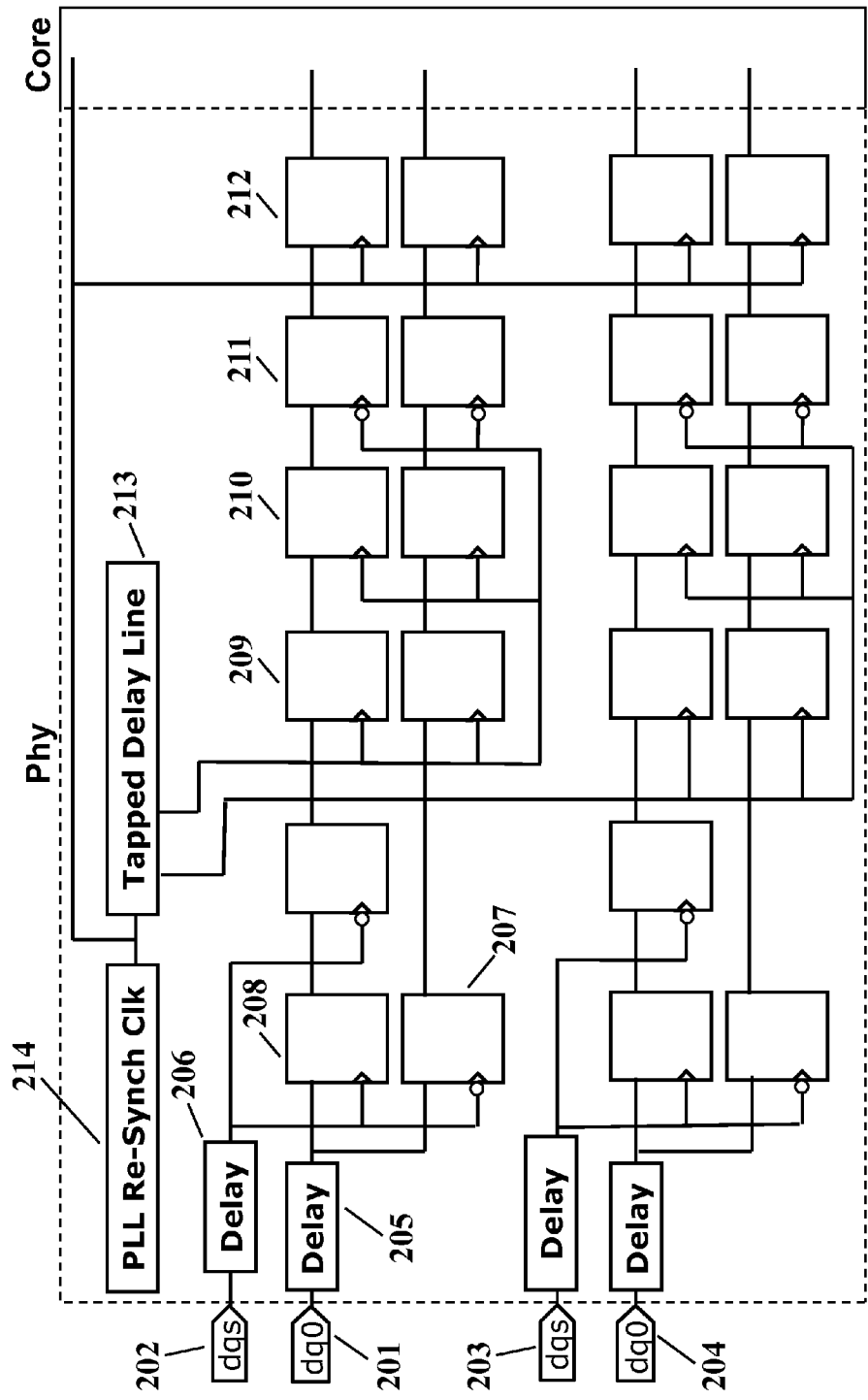
FIG. 2 shows a prior art DDR memory controller where delay elements are used on both dq and dqs signals and a form of FIFO is used for data levelization, the FIFO being clocked by a clock that is PLL-synchronized with dqs, the entire circuit contained within the Phy portion of the memory controller.
Figure 3:
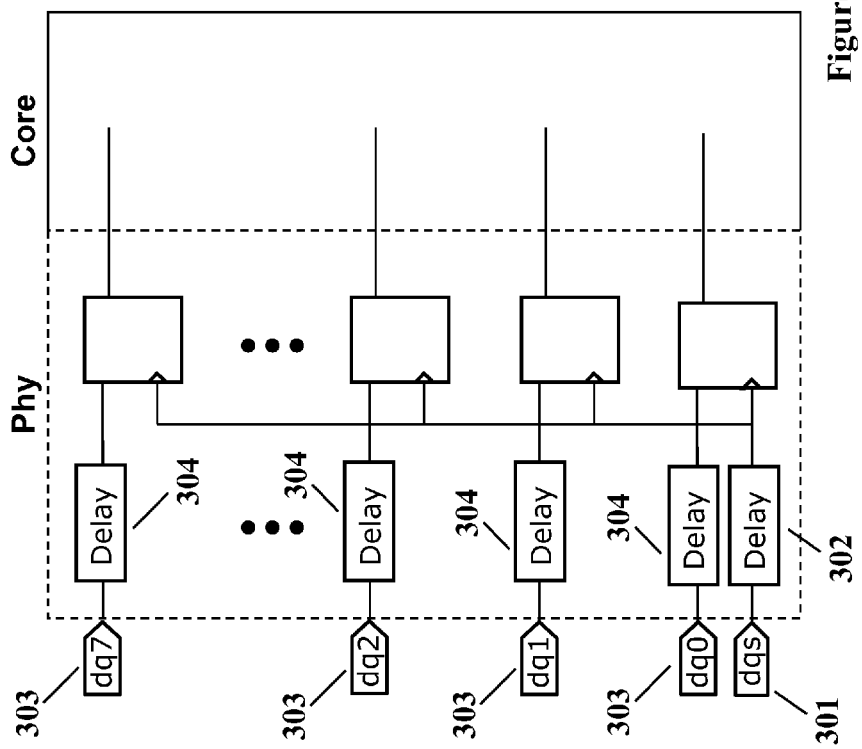
FIG. 3 describes the read data path for a prior art DDR memory controller having delay elements on both dq and dqs inputs.
Figure 9:
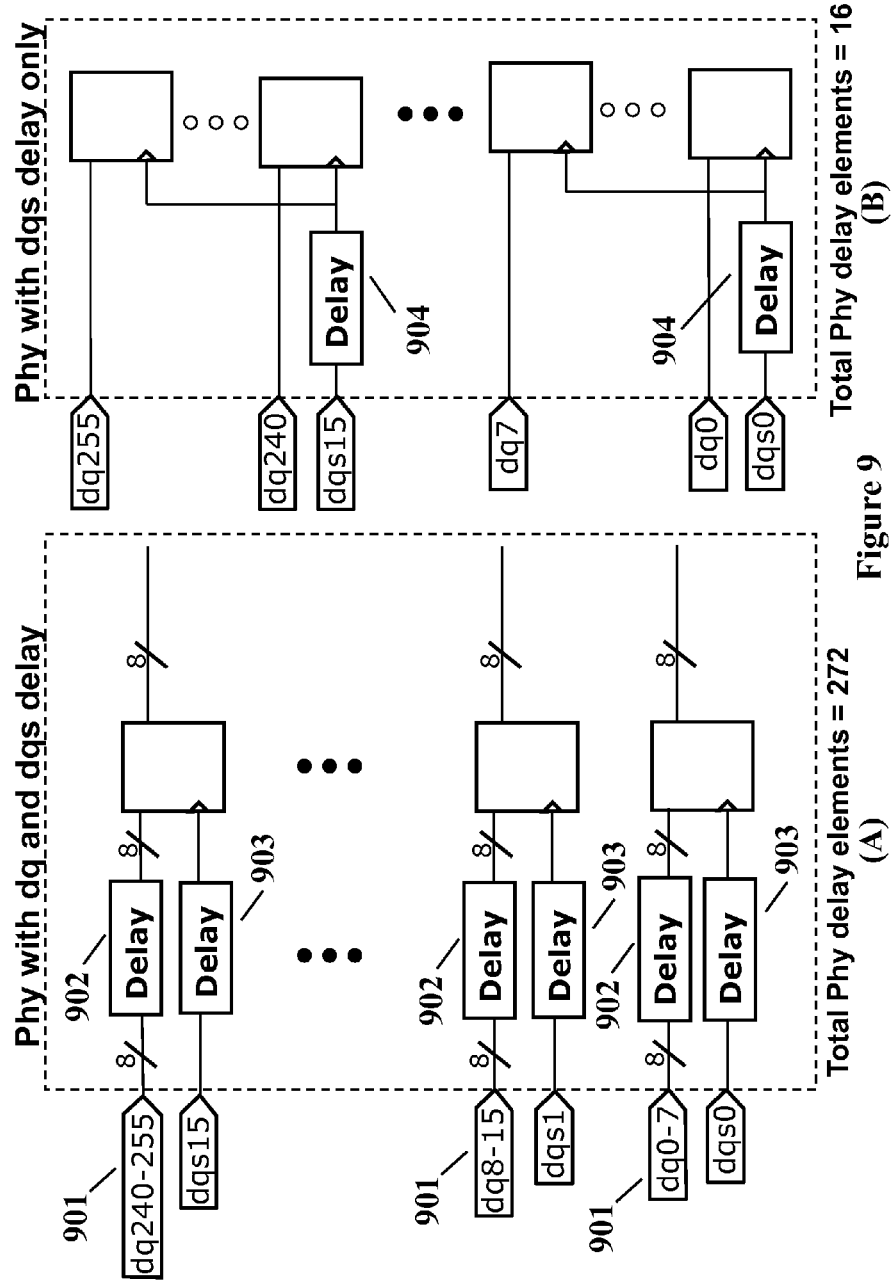
FIG. 9 shows a comparison of prior art memory controllers which utilize delay elements on both dq and the dqs inputs when compared with the memory controller of one embodiment of the present invention, with emphasis on the number of total delay elements required for each implementation.

FIG. 9 shows a comparison between an embodiment the present invention and prior art memory controllers according to FIGS. 2 through 4, with emphasis on the amount of silicon real estate required based on the numbers of delay elements introduced for an example implementation containing a total of 256 data bits. Notice in FIG. 9a that prior art memory controllers that include delay elements on all dq data bits 901 would require 256 delay elements 902 for dq inputs in addition to 16 delay elements 903 for dqs inputs. In contrast to this, FIG. 9b shows an implementation according to one embodiment of the present invention where only dqs input delay elements 904 are required and therefore the total number of delay elements in the Phy for an embodiment the present invention is 16 versus 272 for the prior art implementation of FIG. 9a.

Figure 10:
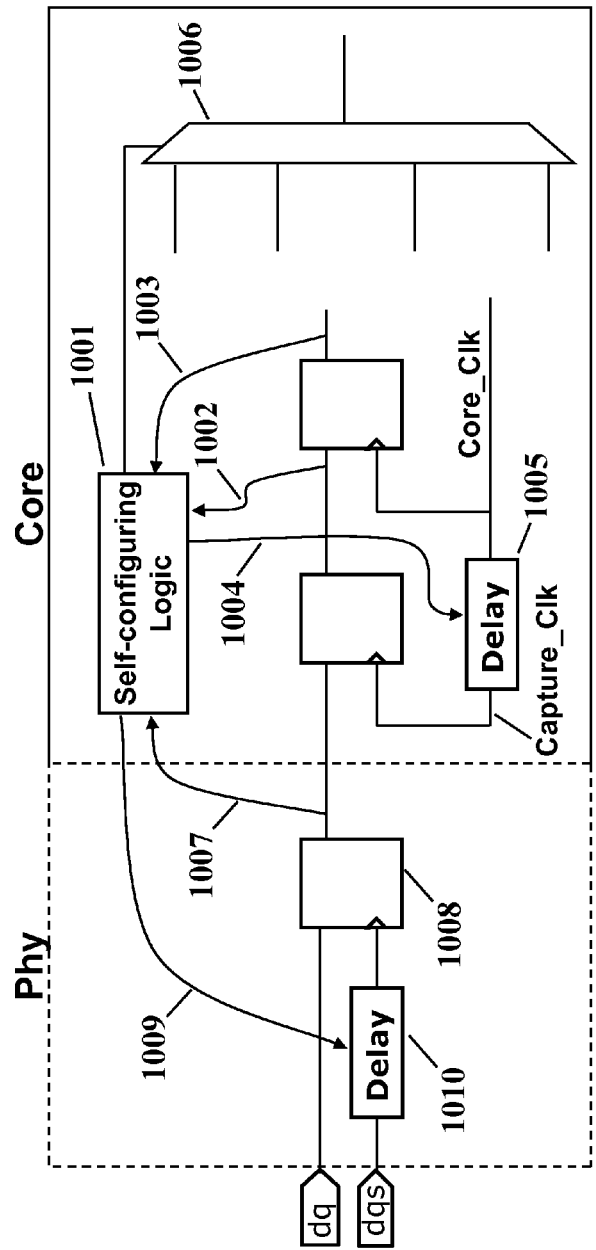
FIG. 10 shows a diagram for the read data path of a DDR memory controller according to one embodiment of the present invention with emphasis on the inputs and outputs for the Self Configuring Logic function which controls the programmable delay elements.

FIG. 10 shows a diagram of how the Self Configuring Logic (SCL) function 1001 interfaces with other elements of the DDR memory controller according to an embodiment of the present invention. In a first embodiment of the present invention, the SCL 1001 receives the output 1002 of the first core domain register (clocked by Capture_Clk) as well as the output 1003 of the second core domain register (clocked by Core_Clk). In turn, the SCL provides output 1004 which controls the delay of the delay element 1005 which creates Capture_Clk. The SCL also drives multiplexer 1006 which selects the different paths which implement the CAS latency compensation circuit as previously described in FIG. 7 where multiplexer 706 performs this selection function.

In an alternate embodiment of the present invention, SCL 1001 also receives data 1007 from input data register 1008, and in turn also controls 1009 dqs delay element 1010, thereby enabling a much finer degree of control for the dqs delay function than is normally utilized in most memory controller designs, as well as allowing the dqs delay to be initialized as part of the power on initialization test and calibration operation.

Figure 11:
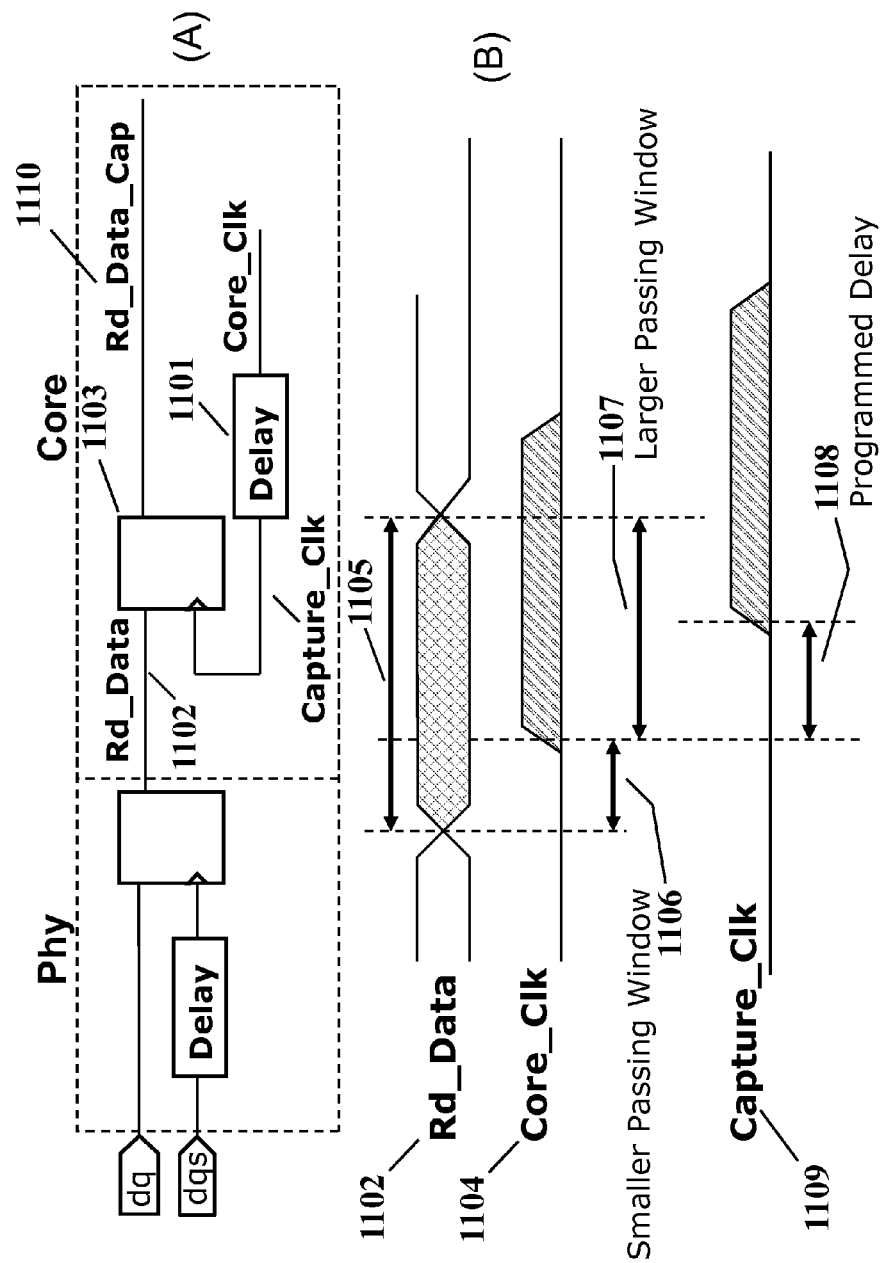
FIG. 11 describes the timing relationships involved in choosing the larger passing window when the delay element producing Capture_Clk is to be programmed according to one embodiment of the present invention.

FIG. 11 describes the concept behind the process for choosing the larger passing window when positioning Capture_Clk. As described previously for an embodiment the present invention, the core clock signal is delayed in element 1101 as shown in FIG. 11a to produce Capture_Clk. FIG. 11b shows a timing diagram where the RD_Data signal 1102 is to be captured in first core domain register 1103. As shown in FIG. 11b, the position of core clock 1104 rarely falls in the center of the time that RD_Data 1102 is valid, in this instance being position towards the beginning of the valid time period 1105 for RD_Data. In this instance, two passing windows 1106 and 1107 have been created, with 1106 being the smaller passing window and 1107 being the larger passing window.

Therefore in the scenario shown in FIG. 11b, some amount of programmed delay 1108 would be programmed into delay element 1101 in order that Capture_Clk 1109 may be positioned in the larger passing window 1107.

Figure 12:
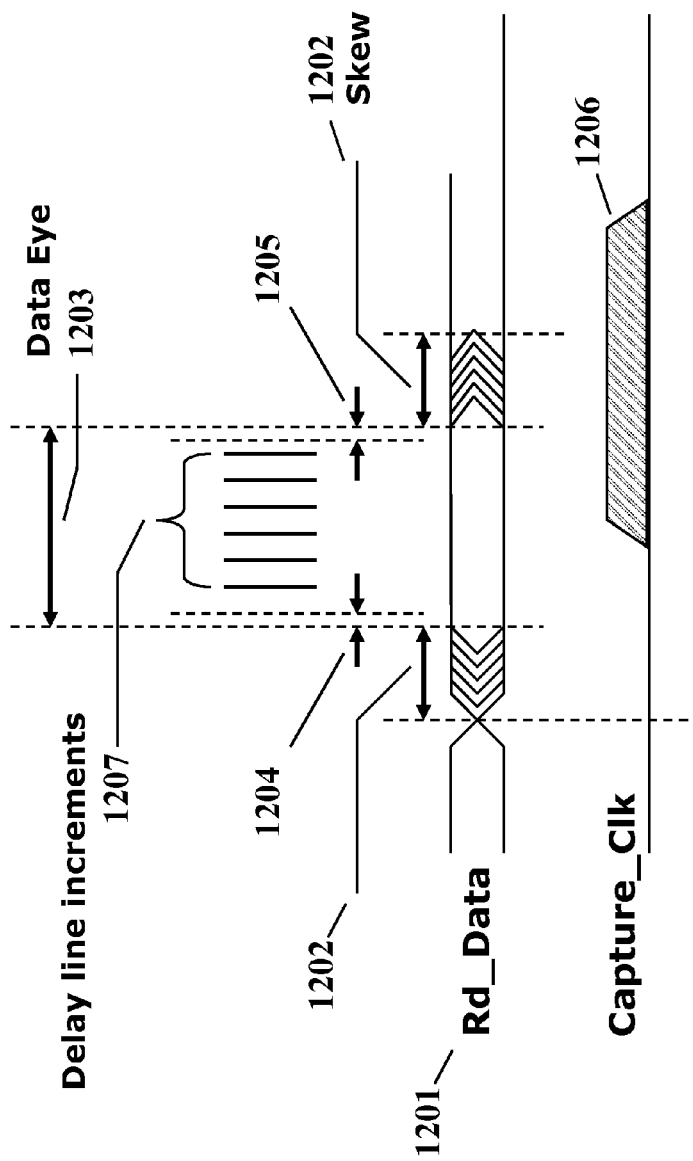
FIG. 12 shows a timing diagram for the data eye indicating the common window for valid data across a group of data bits such as a byte lane, given the skew that exists between all the data bits.

FIG. 12 shows a timing diagram for a group of data bits in a byte lane such as Rd_Data 1201 where the timing skew 1202 across the group of bits is shown as indicated. The common time across all data bits in the group where data is simultaneously valid is called the data eye 1203. After subtracting setup time 1204 and hold time 1205 from data eye 1203, what remains is the window within which Capture_Clk 1206 may be placed in order to properly clock valid data on all bits of Rd_Data 1201 within the byte lane. Delay line increments 1207 represent the possible timing positions that may be chosen for a programmable delay line to implement core clock delay element 604 that produces Capture_Clk. For all systems there will be a minimum number of delay line increments 1207 for which the power on initialization test will determine that data is captured successfully, achieving that minimum number being necessary for the manufacturer of the system to feel confident that the timing margin is robust enough for a production unit to be declared good. Thus, this number of delay line increments that is seen as a minimum requirement for a successful test is specified and stored in the system containing the memory controller, and is utilized in determining if the power-on initialization and calibration test is successful.

Figure 13:
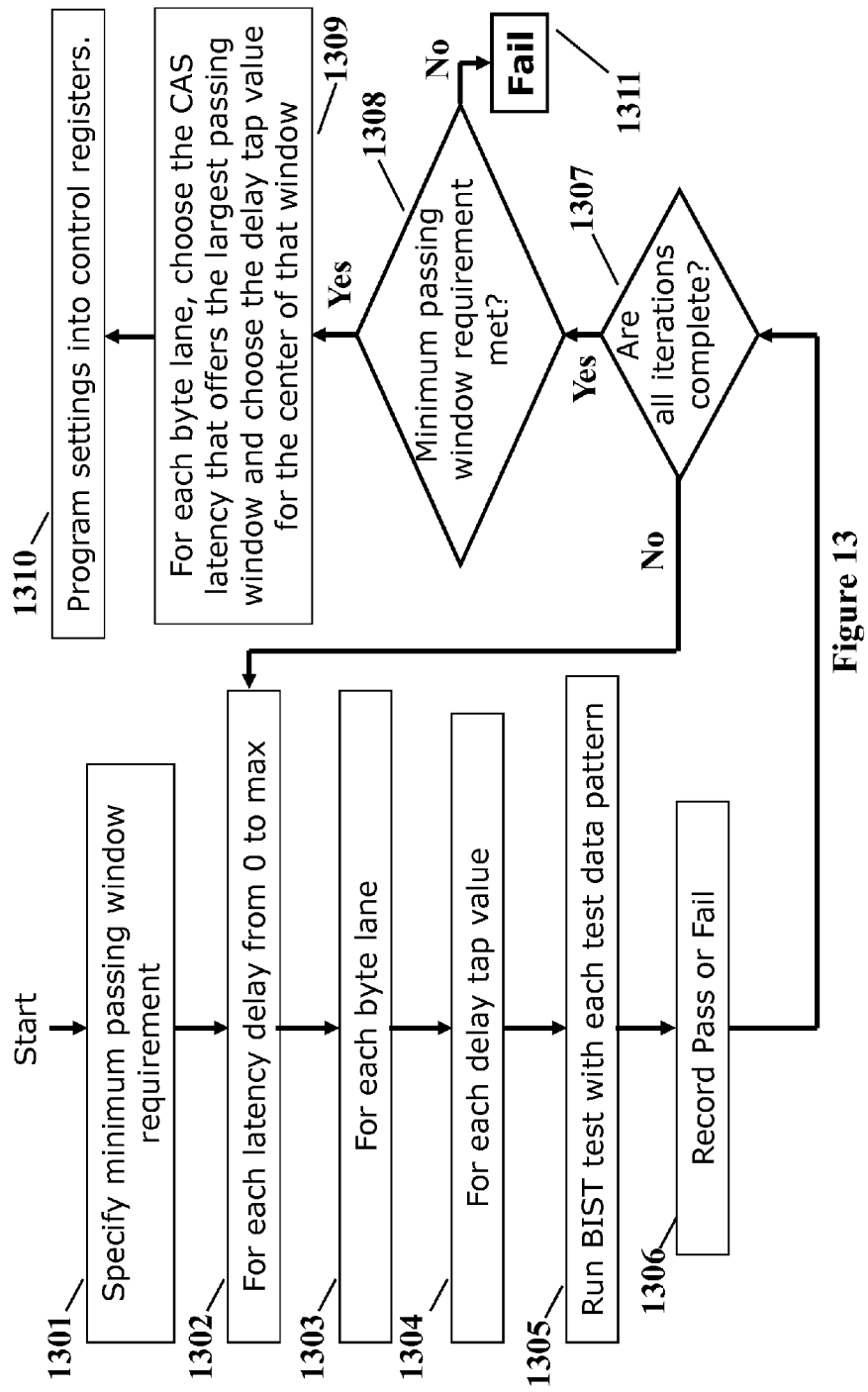
FIG. 13 shows a flow chart for the power-on initialization test and calibration operation according to one embodiment of the present invention, the results of this operation including choosing programmable delay values.

FIG. 13 shows a flow chart for the process implemented according to one embodiment of the present invention for a power-on initialization test and calibration operation. Software or firmware controls this operation and typically runs on a processor located in the system containing the DDR memory and the controller functionality described herein. This processor may be located on the IC containing the memory controller functionality, or may be located elsewhere within the system. In step 1301, a minimum passing window requirement is specified in terms of a minimum number of delay increments for which data is successfully captured, as described in the diagram of FIG. 12. The minimum passing window requirement will be used to determine a pass or fail condition during the test, and also may be used in order to determine the number of delay increments that must be tested and how many iterations of the test loops (steps 1302 through 1307) must be performed. Steps 1302, 1303, 1304, 1305, and 1306 together implement what in general is known as nested "for" loops. Thus, for each latency delay value to be tested according to step 1302, each byte lane will be tested according to step 1303. And, for each byte lane to be tested according to step 1303, each delay tap value within a chosen range of delay tap values will be tested according to step 1304. So, for each specific permutation of latency delay, byte lane, and delay tap value, the BIST test (Built-In Self-Test for the read data test) will be run according to step 1305, and a pass or fail result will be recorded according to step 1306. Once all iterations of the nested "for" loops are completed as determined by step 1307, the processor controlling the power-on initialization and calibration test will then check (step 1308) to see if the minimum passing window requirement has been met as specified in step 1301. If the minimum has not been met, then the system will indicate a failure 1311. If the requirement has been met, then according to step 1309 for each byte lane the processor will choose the latency value that offers the largest passing window, and then choose the delay tap value that places capture clock in the center of that window. Finally, values will be programmed into control registers according to step 1310 such that all delays within the controller system according to this invention are programmed with optimum settings.

Further, it is desirable to provide a DDR memory controller that is calibrated to compensate for system level timing irregularities and for chip process parameter variations—that calibration occurring not only during power-up initialization, but also dynamically during system operation to further compensate for power supply voltage variations over time as well as system level timing variations as the system environment variables (such as temperature) change during operation. DSCL, a dynamic version of the SCL or Self Configuring Logic functionality as described herein, addresses the problem of VT (voltage and temperature) variations during normal operation of a chip that utilizes a DDR memory controller as described herein to access a DRAM. Regular SCL as described earlier is typically run only on system power on. It can calibrate for the system level timing at the time it is run and can compensate for PVT (Process variations in addition to Voltage and Temperature) variations that occur from chip to chip, and do it in the context of the system operation.

Computer memory is vulnerable to temperature changes both in the controller and the corresponding memory modules. As any DDR memory chip or as the chip containing the DDR memory controller heat up, and supply voltage variations occur due to other external factors such as loading experienced by the power supply source, VT variations can cause system level timing to change. These changes can affect the optimal programming settings as compared with those that were produced by operation of the SCL function when calibration was run at power on. Thus, DSCL functionality helps the chip to continuously compensate for VT variations providing the best DRAM timing margin even as system timing changes significantly over time. By performing the necessary calibration in the shortest period of time, DSCL also ensures that the impact on system performance is minimal. DSCL divides the problem of calculating the Capture_Clk delay and the problem of CAS latency compensation into separate problems per FIGS. 16 and 18, and solves each of these problems independently. It also runs independently and parallely in each byte lane. Thus the whole calibration process is greatly speeded up. Specifically, in one embodiment, if the user has an on-board CPU, the non-dynamic SCL could be run within about 2 milliseconds assuming 4 byte lanes and 4 milliseconds for 8 byte lanes. In one embodiment of the dynamic SCL, regardless of 4 or 8 byte lanes, SCL would run within 1 micro-second.

The operation of the DSCL functionality described herein utilizes portions of the existing SCL circuitry previously described and utilizes that existing circuitry during both the calibration phase and operational phase, however new circuitry is added for DSCL and the calibration phase is broken into two sub-phases. One of these sub-phases corresponds to the process described in FIG. 16, and the other sub-phase corresponds to the process described in FIG. 18.

Figure 14:
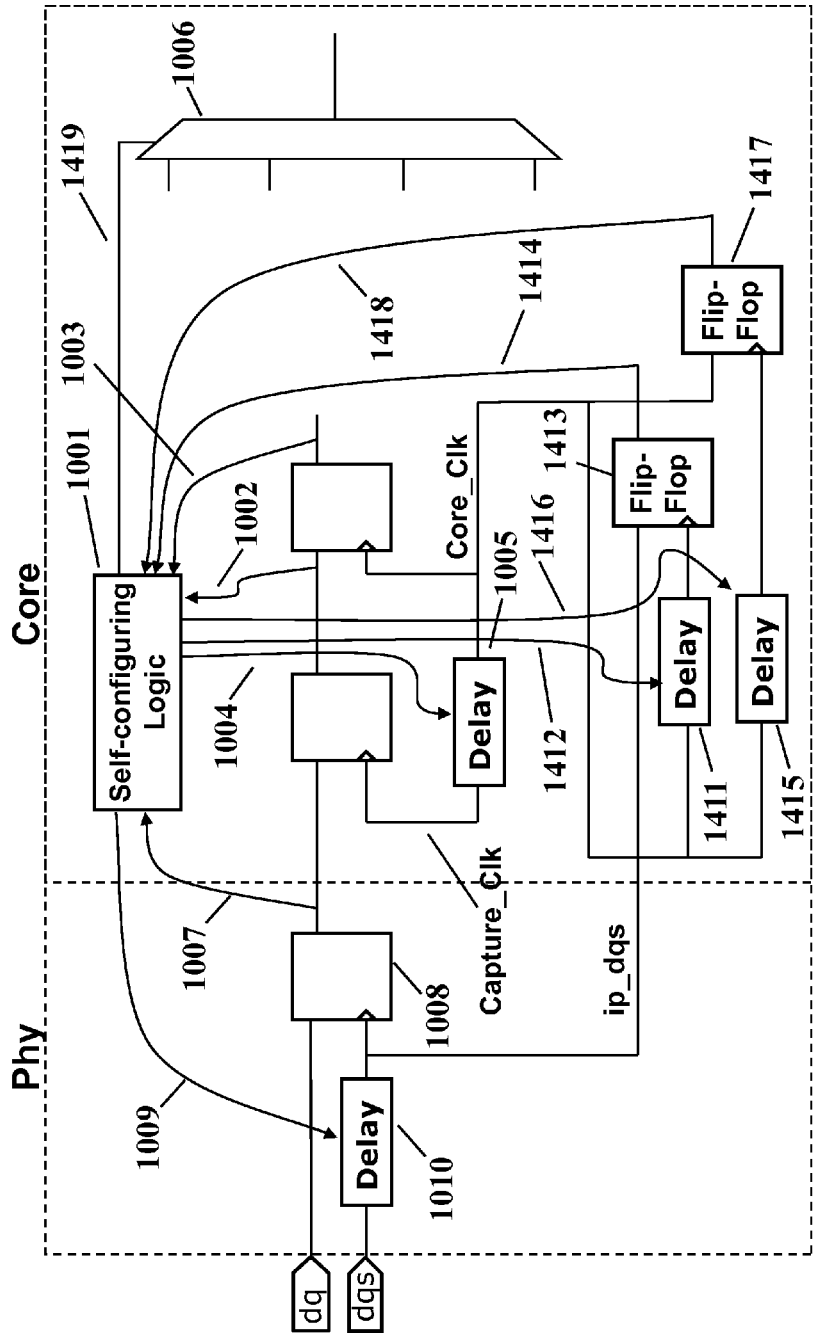
FIG. 14 shows the functionality of FIG. 10 with circuitry added to implement a dynamically calibrated DDR controller function according to one embodiment of the invention, in particular to determine an optimum Capture_Clk delay.

FIG. 14, when compared with FIG. 10, shows the circuit component additions which may be present in order to support the dynamically calibrated version of the DDR memory controller as described herein. The purpose of the additions to FIG. 10 as shown in FIG. 14 is to support the first phase of the SCL calibration whereby an optimum Capture_Clk delay is determined according to the process of FIG. 16. The optimum Capture_Clk value is determined by the Self-configuring Logic 1001 output 1004 to the Delay element 1005. Here, the delayed version of the dqs input signal produced by delay element 1010 and herein called ip_dqs is sampled in flip-flop 1413. Flip-flop 1413 is clocked by the output of delay element 1411 which delays Core_Clk. The output of flip-flop 1413 is connected 1414 to the self configuring logic function 1001. Core-Clk is also delayed in delay element 1415 which in turn samples Core_Clk in flip-flop 1417. The output of flip-flop 1417 is connected 1418 to the self configuring logic function 1001. Delay elements 1411 and 1415 are controlled respectively by signals 1412 and 1416 from self configuring logic function 1001. An output 1419 of SCL logic function 1001 controls the select lines of multiplexer 1006 which is the same multiplexer as shown earlier as multiplexer 706 in FIG. 7 and is used to select captured read data which is delayed by different increments according to which flip-flop delay chain path is most appropriate.

Figure 15:
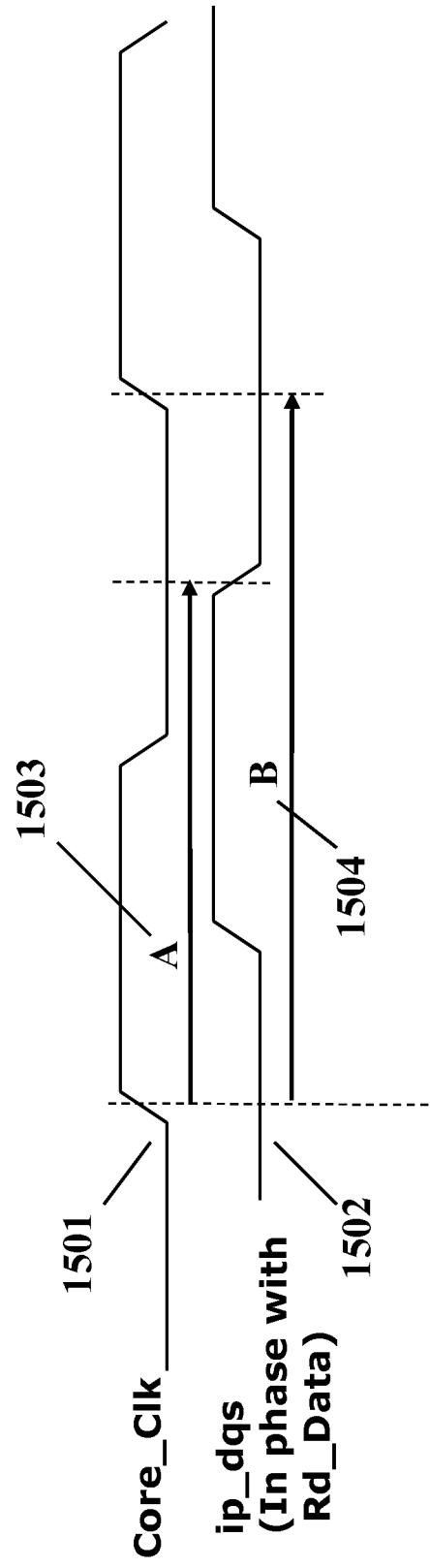
FIG. 15 shows a timing diagram where Core_Clk and ip_dqs are delayed and sampled as part of implementing a dynamically calibrated DDR controller function according to one embodiment of the invention.
Figure 16:
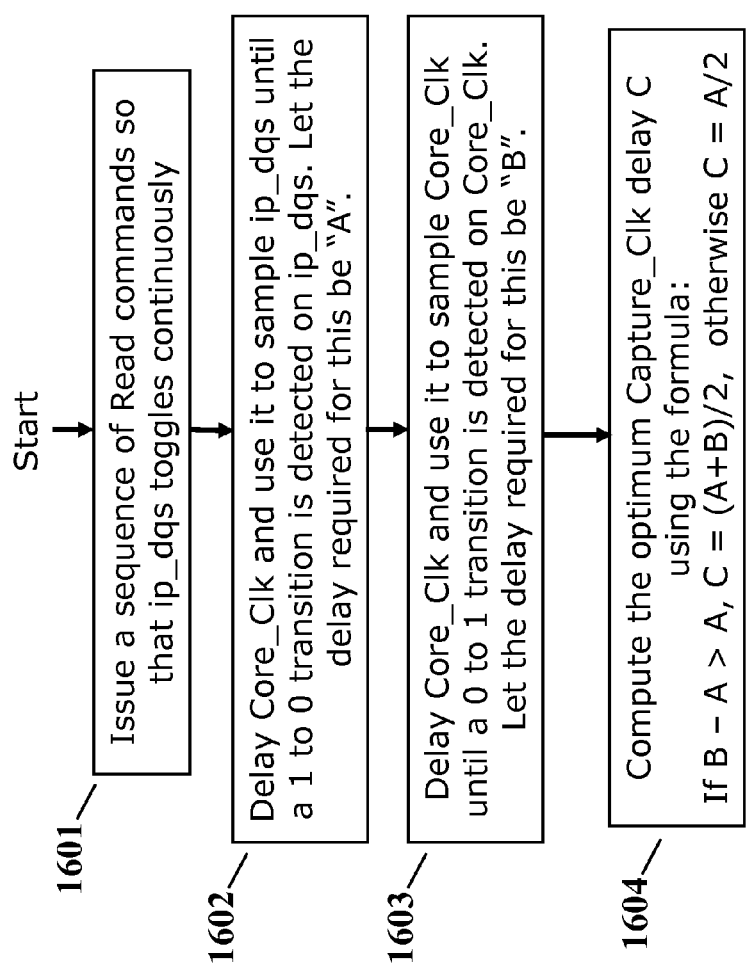
FIG. 16 shows a flowchart describing the process of delaying and sampling both ip_dqs and Core_Clk, and for computing an optimum Capture_Clk delay.

FIG. 15 graphically shows some of the timing delays that are manipulated as part of the dynamic calibration sequence of the DDR memory controller per one embodiment of the present invention and as described in FIG. 16. Here, Core_Clk 1501 is delayed by different values, here marked value "A" 1503 in FIG. 15. The ip_dqs signal 1502 is also delayed by different values, here marked value "B" 1504.

FIG. 16 shows a flowchart for the dynamic calibration procedure in order to determine an optimum delay for Core_Clk delay element 1005 in order to produce an optimum timing for the Capture_Clk signal. In step 1601, a sequence of read commands is issued so that the ip_dqs signal toggles continuously. In step 1602, the Core_Clk signal is delayed and used to sample ip_dqs at different delay increments until a 1 to 0 transition is detected on ip_dqs, whereby this value for the Core_Clk delay is recorded as value "A". In step 1603, the Core_Clk signal is delayed and used to sample Core_Clk at different delay increments until a 0 to 1 transition is detected on Core_Clk, whereby this value for the Core_Clk delay is recorded as value "B". In step 1604, the optimum delay value "C" for delaying Core_Clk in order to produce an optimum Capture_Clk signal is computed according to the formula: if B−A>A then the resulting value C=(A+B)/2, otherwise C=A/2.

Figure 17:
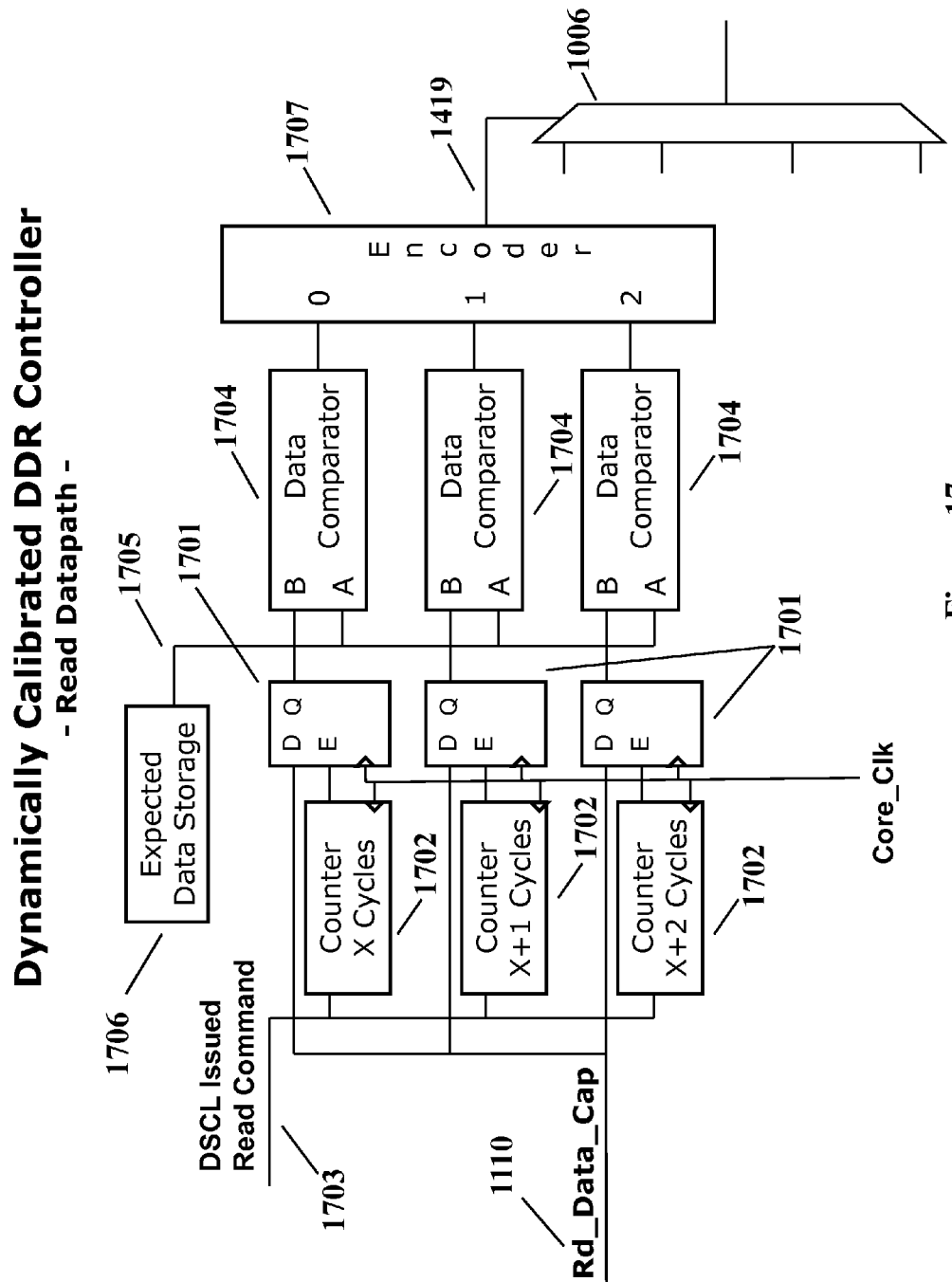
FIG. 17 includes circuitry added for dynamic calibration, in particular for a second phase according to the process of FIG. 18.
Figure 18:
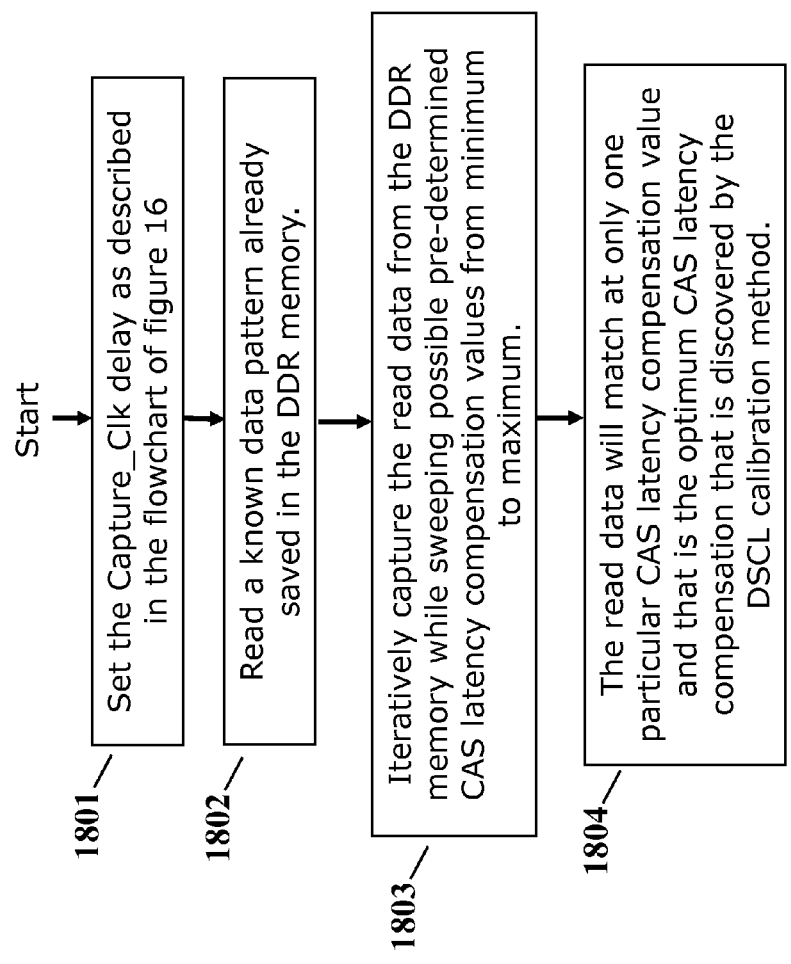
FIG. 18 shows a flowchart describing the process of iteratively capturing read data from the DDR memory while sweeping different CAS latency compensation values to determine the settings for the DDR memory controller that provide the optimum CAS latency compensation.

FIG. 17 shows the circuitry within the DSCL functionality that is utilized during the portion of the calibration sequence described in the process of FIG. 18. According to FIG. 11, read data has been captured in flip-flop 1103 by Capture_Clk to produce Rd_Data_Cap 1110. Rd_Data_Cap 1110 is then captured in each of flip-flops 1701 on an edge of Core_Clk and are enabled to register Rd_Data_Cap by one of counters 1702 which themselves are also clocked by Core_Clk. Counters 1702 are enabled to start counting by a Read Command 1703 issued by the DSCL functionality. The outputs of flip-flops 1701 each go to a data comparator 1704 where they are compared with a predefined data value 1705 which is stored in the DDR memory controller in location 1706 and has also been previously placed in the DDR memory itself as described in the process of FIG. 18. The outputs of the data comparators enter encoder 1707 whose output 1419 controls multiplexer 1006 which chooses a flip-flop chain delay path from those previously described in FIG. 6.

FIG. 18 shows a procedure for operating the DDR memory controller in order to calibrate the controller during dynamic operation, and in particular to determine the optimum overall CAS latency compensation. First, in step 1801 the Capture_Clk delay is set to the previously determined optimum value according to the procedure described in the flowchart of FIG. 16. In step 1802 a known data pattern is read from a DDR memory connected to the DDR memory controller. This known data pattern originates in a stored location 1706 in the DDR controller device and would typically have been previously saved or located in the DDR memory. If such a pattern is not available in the DDR memory, an appropriate pattern would be written to the DDR memory before this step and subsequent steps are executed. If, in order to write such a known data pattern to the DDR memory, existing data at those memory locations needs to be preserved, the existing data may be read out and saved inside the memory controller or at another (unused) memory location, and then may be restored after the DSCL dynamic calibration sequence per FIGS. 16 and 18 is run. In step 1803 read data is captured from the DDR memory in an iterative manner while sweeping possible predetermined CAS latency compensation values from a minimum to a maximum value utilizing the different delay paths that can be chosen with the circuitry shown in FIG. 17. In step 1804, when the read data matches at a particular CAS latency compensation, the parameters and settings that produced that optimum value of CAS latency compensation, i.e. the chosen delay path through the flip-flop chains feeding multiplexer 706 in combination with the previously determined optimum Capture_Clk delay, are recorded as the optimum parameters for the CAS latency compensation value and used thereafter during normal operation until another dynamic calibration sequence is performed.

Thus, the foregoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. For example, unless otherwise specified, steps preformed in the embodiments of the invention disclosed can be performed in alternate orders, certain steps can be omitted, and additional steps can be added. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A memory interface circuit for read operations, comprising:
    one or more controller circuits for controlling the memory interface circuit;
    one or more read data delay circuits for providing CAS latency compensation for a plurality of byte lanes, by programmably delaying the read data for each byte lane in response to control settings;
    wherein the control settings for the one or more read data delay circuits for providing CAS latency compensation are determined and set using said one or more controller circuits according to a dynamic calibration procedure performed from time to time during functional operation of the memory interface circuit; and
    wherein determining and setting the control settings for the one or more read data delay circuits for providing CAS latency compensation for the plurality of byte lanes is performed independently for each byte lane and parallelly among the plurality of byte lanes.

2. The memory interface circuit of claim 1, wherein the one or more read data delay circuits for providing CAS latency compensation comprise at least two or more clocked storage elements.

3. The memory interface circuit of claim 2, wherein a plurality of clocked storage elements among the at least two or more clocked storage elements are in series.

4. The memory interface circuit of claim 3, wherein the one or more read data delay circuits for providing CAS latency compensation, delay read data by variable numbers of clock edges according to the control settings.

5. The memory interface circuit of claim 1, wherein the dynamic calibration procedure is performed from time to time during functional operation of a system circuit including the memory interface circuit and at least one memory device connected to the memory interface circuit.

6. The memory interface circuit of claim 1, further comprising one or more expected read data memories for storing data values corresponding to expected values for read data at one or more specific CAS latency compensation delay settings.

7. The memory interface circuit of claim 1 wherein determining and setting CAS latency compensation independently for each byte lane and parallelly among the plurality of byte lanes further comprises for each of the plurality of byte lanes independently and in parallel:
    reading a known data pattern previously saved or located in one or more memory devices connected to the memory interface circuit;
    iteratively capturing read data from the one or more memory devices at different CAS latency compensation control settings;
    when for one of the plurality of byte lanes, the captured read data matches an expected read data value at a specific CAS latency compensation control setting, recording the specific CAS latency compensation control setting as an optimum CAS latency compensation control setting for that byte lane; and
    programming control settings that produced the optimum CAS latency compensation for the byte lane into one or more control registers in the memory interface circuit.

8. The memory interface circuit of claim 7, wherein iteratively capturing read data from the one or more memory devices at different CAS latency compensation control settings is performed by varying CAS latency compensation delay settings from a minimum to a maximum CAS latency compensation delay setting.

9. The memory interface circuit of claim 7, wherein when the known data pattern is previously saved or located in the one or more memory devices connected to the memory interface circuit, application data contained in the one or more memory devices is temporarily moved to one or more different locations.

10. The memory interface circuit of claim 9, wherein said one or more different locations includes at least one location contained within a host device containing the memory interface circuit wherein said one location is outside of the memory interface circuit.

11. The memory interface circuit of claim 1, wherein one or more capture clocks capture read data received from one or more memory devices connected to the memory interface circuit, and wherein timing for the one or more capture clocks is controlled by said one or more controller circuits.

12. The memory interface circuit of claim 11, wherein the memory interface circuit is contained within a host device and wherein the one or more capture clocks are derived from one or more core clocks originating within the host device.

13. A memory interface circuit for read operations, comprising:
    one or more controller circuits for controlling the memory interface circuit;
    one or more read data delay circuits for providing CAS latency compensation for a plurality of byte lanes by programmably delaying the read data for each byte lane in response to control settings; and wherein the control settings for one or more read data delay circuits for providing CAS latency compensation for the plurality of byte lanes are determined and set independently for each byte lane and parallelly among the plurality of byte lanes.

14. The memory interface circuit of claim 13, further comprising:
an expected read data memory designated for storing expected read data values; and
wherein determining control settings for the one or more read data delay circuits for providing CAS latency compensation, includes:
iteratively capturing read data from one or more memory devices connected to the memory interface circuit at different CAS latency compensation control settings; and
comparing the iteratively captured read data with expected read data values.

15. The memory interface circuit of claim 14, further comprising:
wherein for a particular byte lane, when the captured read data matches an expected read data value at a specific CAS latency compensation control setting, the specific CAS latency compensation control setting is recorded as an optimum CAS latency compensation control setting for that byte lane.

16. The memory interface circuit of claim 14, wherein the memory for storing expected read data values is located within a host device containing the memory interface circuit.

17. The memory interface circuit of claim 14, wherein the one or more read data delay circuits for providing CAS latency compensation comprise at least two or more clocked storage elements.

18. The memory interface circuit of claim 17, wherein a plurality of clocked storage elements among the at least two or more clocked storage elements are in series.

19. The memory interface circuit of claim 18, wherein the one or more read data delay circuits for providing CAS latency compensation delay read data by variable numbers of clock edges according to an optimum CAS latency compensation control setting for that byte lane.

* * * * *